(12) United States Patent
Yedidia et al.

(10) Patent No.: US 8,595,589 B2
(45) Date of Patent: Nov. 26, 2013

(54) QUASI-CYCLIC LOW-DENSITY PARITY-CHECK CODES

(75) Inventors: Jonathan Yedidia, Cambridge, MA (US); Yige Wang, Shrewsbury, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 136 days.

(21) Appl. No.: 13/251,180

(22) Filed: Sep. 30, 2011

(65) Prior Publication Data

US 2013/0086445 A1 Apr. 4, 2013

(51) Int. Cl.
*H03M 13/00* (2006.01)
(52) U.S. Cl.
USPC ............................ 714/758; 714/755; 714/752
(58) Field of Classification Search
USPC .......................................... 714/752, 755, 758
See application file for complete search history.

(56) References Cited

U.S. PATENT DOCUMENTS 8,127,209 B1 * 2/2012 Zhang et al. ................. 714/780

OTHER PUBLICATIONS

Esmaeili et al., Structured quasi-cyclic LDPC codes with girth 18 and column-weight j>=3, 2010, Int. J. Electron Communication (AEU) vol. 64, pp. 202-217.*
Bocharova et al., Searching for voltage graph-based LDPC tailbiting codes with large girth, Aug. 3, 2011, arXIV Journal, pp. 1-14.*
Tavares, M.B.S. et al: "LDPC Convolutional Codes Based on Braided Convolutional Codes", Information Theory, 2008, ISIT 2008, International Symposium on, IEEE, Piscataway, NJ, USA, Jul. 6, 2008, pp. 1035-1039, XP031303066, ISBN: 978-1-4244-2256-2.

* cited by examiner

*Primary Examiner* — Sam Rizk
(74) *Attorney, Agent, or Firm* — Dirk Brinkman; Gene Vinokur

(57) ABSTRACT

A system and a method for determining a quasi-cyclic (QC) low-density parity-check (LDPC) code, such that the QC LDPC code has no trapping sets are disclosed. A set of matrices representing a family of QC LDPC codes are acquired, wherein each QC LDPC code is a tail-biting spatially-coupled code of girth not less than eight, and wherein each column of each matrix in the set has a weight not less than four. Based on a trapping set pattern, a matrix from the set of matrices is selected such that the matrix represents the QC LDPC code with no trapping sets. The matrix can be stored into a memory.

19 Claims, 10 Drawing Sheets

QUASI-CYCLIC LOW-DENSITY PARITY-CHECK CODES

FIELD OF THE INVENTION

This invention relates generally to quasi-cyclic (QC) low-density parity-check (LDPC) codes, and more particularly to constructing QC LDPC codes with no trapping sets.

BACKGROUND OF THE INVENTION

Two broad classes of methods can be used for the construction of low-density parity-check (LDPC) codes. One class is based on random graph constructions, while the other class is based on structured algebraic constructions. Random graph constructions can produce LDPC codes that approach the Shannon capacity.

LDPC graph constructions normally use a "Tanner graph," which is a bi-partite graph including "variable" nodes representing the codeword bits, and "check" nodes representing the parity checks, where a variable node is connected to a check node by an edge if and only if the corresponding entry in the parity check matrix for the code is nonzero. Tanner graphs are well known.

Although LDPC codes based on highly random Tanner graph construction can closely approach the Shannon limit, those constructions are difficult to implement in hardware because the irregular connections between check and variable nodes in the Tanner graph of the code imply high complexity wiring. In actual implementations, more structured constructions are preferred because those provide practical wiring, and straightforward parallelism in the decoders.

Quasi-cyclic LDPC (QC LDPC) codes are structured graph constructions that use a parity check matrix which is partitioned into sub-matrices that have a circulant structure. Because the structured graph construction is practical to implement in hardware, QC LDPC codes are used in a variety communication networks, such as networks implemented according to the IEEE 802.16e, DVB-S2, and IEEE 802.11 standards.

For most applications, it is important to optimize decoding performance in a "water-fall" regime where the signal-to-noise ratio (SNR) is relatively low. However, for some applications, optimizing water-fall performance is not sufficient. One must also avoid "error floors" that are characteristic of many LDPC codes in higher SNR regimes. The error floor in the performance curve means that the decoding failure rate does not continue to decrease as the SNR increases. Eliminating or lowering error floors is particularly important for applications that require extreme reliability demands, including high density data storage, and high speed fiber-optic communication systems.

Generally, QC LDPC codes are constructed based on a wide variety of techniques, including finite geometries, finite fields, and combinatorial designs. Recently, there has also been great interest in a class of "convolutional," or "spatially-coupled" codes, which are much more structured than the conventional random constructions, but have also been shown to closely approach the Shannon capacity, or even to achieve the Shannon capacity on a binary erasure channel (BEC). Those codes are significant here, because the codes can be implemented using quasi-cyclic constructions, and the codes should thus be able to achieve very good performance while retaining the practicality of other structured QC LDPC codes.

Error floor issues for LDPC codes that are decoded using belief propagation (BP) or related decoders are generally caused by "trapping sets." A trapping set is a set of a small number of bits that reinforce each other in their incorrect beliefs. Trapping sets of bits are invariably arranged in clustered short cycles in a Tanner graph for the code. One way to remove the trapping sets is to design the Tanner graph so that clusters of short cycles do not exist. An alternative, and at least conceptually simpler approach is to design codes with larger girths. The "girth" of a code is the length of the shortest cycle in the Tanner graph. By removing short cycles, we remove potentially dangerous configurations of cycles, and hopefully lower the error floor. Unfortunately, there are no guarantees that the code with large girth, e.g., eight or greater, will have no trapping sets.

Therefore, there is a need in the art to provide a method for determining QC LDPC codes having no trapping sets.

SUMMARY OF THE INVENTION

It is an object of the present invention to provide a system and a method for constructing a quasi-cyclic (QC) low-density parity-check (LDPC) code, such that the QC LDPC code has no trapping sets. Another object of the invention is to determine such the QC LDPC that optimizes waterfall performance code and avoids error floors.

A trapping set is a set of a small number of bits that reinforce each other in their incorrect beliefs when decoded using a belief propagation decoder, or a related decoder such as a bit-flipping decoder. Usually, a QC LDPC code can have many possible trapping sets, which are very difficult to detect. If one would attempt to test the QC LDPC code for a presence of all possible trapping sets, a database of many thousands of different patterns of possible trapping sets would be required, and such constructing and verifying the completeness of such a database would be impossible, or at least impractical in real time.

Various embodiments of the invention are based on a discovery that tail-biting spatially-coupled codes of girth eight or greater having columns of weight four have very few trapping sets. Furthermore, in such codes, all possible trapping sets are related to a particular configuration of bits and checks, which make possible to verify that a particular code does not have any trapping sets. Accordingly, this discovery makes it possible to construct QC LDPC codes with no trapping sets.

The abovementioned discovery is based on extensive research and testing. Tail-biting spatially-couple codes were selected in part because such codes have excellent waterfall performance. Accordingly, the QC LDPC code constructed by the embodiments of the invention has excellent waterfall performance and avoids error floors, because the error floors are caused by the trapping sets.

Specifically, some embodiments of the invention are based on a realization that a matrix representing the QC LDPC code with no trapping sets can be selected from a set of base matrices representing a family of QC LDPC codes, wherein each code in the family is a tail-biting spatially-coupled code of girth not less than eight, and wherein each column of each matrix in the set has a weight not less than four. The selection is based on a trapping set pattern that can be detected using the base matrix representing a QC LDPC code.

The trapping set pattern includes a pattern of six bits in the Tanner graph of the QC LDPC code. If the trapping set pattern is a pattern of "fully connected" six bits, then this trapping set pattern indeed includes the trapping set. More specifically, the "fully connected" six bits form two groups of three bits, wherein every bit in one group is connected to every bit in the other group. If the trapping set pattern is a pattern of nearly fully connected six bits, this trapping set pattern has a potential to include the trapping set, but might in fact not include one. Thus, such trapping set pattern is tested for the presence of a trapping set. The nearly fully connected six bits form two groups of three bits, including a first group and a second group, wherein a first bit and a second bit of the first group is connected to every bit in the second group, and wherein a third bit of the first group is connected to two bits in the second group.

Accordingly, one embodiment of the invention discloses a method for determining a quasi-cyclic (QC) low-density parity-check (LDPC) code, such that the QC LDPC code has no trapping sets. The method includes acquiring a set of matrices representing a family of QC LDPC codes, wherein each QC LDPC code is a tail-biting spatially-coupled code of girth not less than eight, and wherein each column of each matrix in the set has a weight not less than four, and selecting, based on a trapping set pattern, a matrix from the set of matrices, such that the matrix represents the QC LDPC code with no trapping sets. The resulting QC LDPC code can be stored into a memory for encoding or decoding process.

Another embodiment discloses system for encoding data based on a quasi-cyclic (QC) low-density parity-check (LDPC) code, including a source for providing the data; a memory for storing QC LDPC code represented by a parity check matrix, wherein the parity check matrix represents a tail-biting spatially-coupled (TBSC) QC LDPC code with no trapping sets; and an encoder for encoding the data using the TBSC QC LDPC code to produce an encoded data, and for transmitting the encoded data over a channel. The TBSC QC LDPC code may have a girth at least equal to eight, and a weight of a majority of columns in the matrix equal to four.

Yet another embodiment discloses a method for determining a quasi-cyclic (QC) low-density parity-check (LDPC) code, such that the QC LDPC code has no trapping sets, including steps of: determining a skeleton base matrix of a tail-biting spatially-coupled code such that a weight of each column equals four; applying to the skeleton base matrix a girth-maximization procedure to produce the set of matrices representing a family of QC LDPC codes, wherein each QC LDPC code is a tail-biting spatially-coupled code of girth not less than eight, and wherein each column of each matrix in the set has a weight not less than four; selecting, from the set of matrices, a preliminary matrix having in a corresponding Tanner graph no pattern of fully connected six bits, wherein the fully connected six bits form two groups of three bits, wherein every bit in one group is connected to every bit in the other group; testing, for each set of candidate elements in the preliminary matrix forming a pattern of nearly-fully connected six bits in the corresponding Tanner graph, whether the set of candidate elements includes a trapping set, wherein the nearly-fully connected six bits form two groups of three bits, including a first group and a second group, wherein a first bit and a second bit of the first group is connected to every bit in the second group, and wherein a third bit of the first group is connected to two bits in the second group; and finding the preliminary matrix as a matrix representing the QC LDPC code with no trapping sets, if the trapping set is not found; and otherwise repeating the selecting, the testing, and the finding, wherein the steps of the method are performed by a processor.

BRIEF DESCRIPTION OF THE DRAWINGS

FIGS. 4-6 are examples of matrices determined by various embodiments of the invention

DETAILED DESCRIPTION OF THE PREFERRED EMBODIMENT

Figure 1:
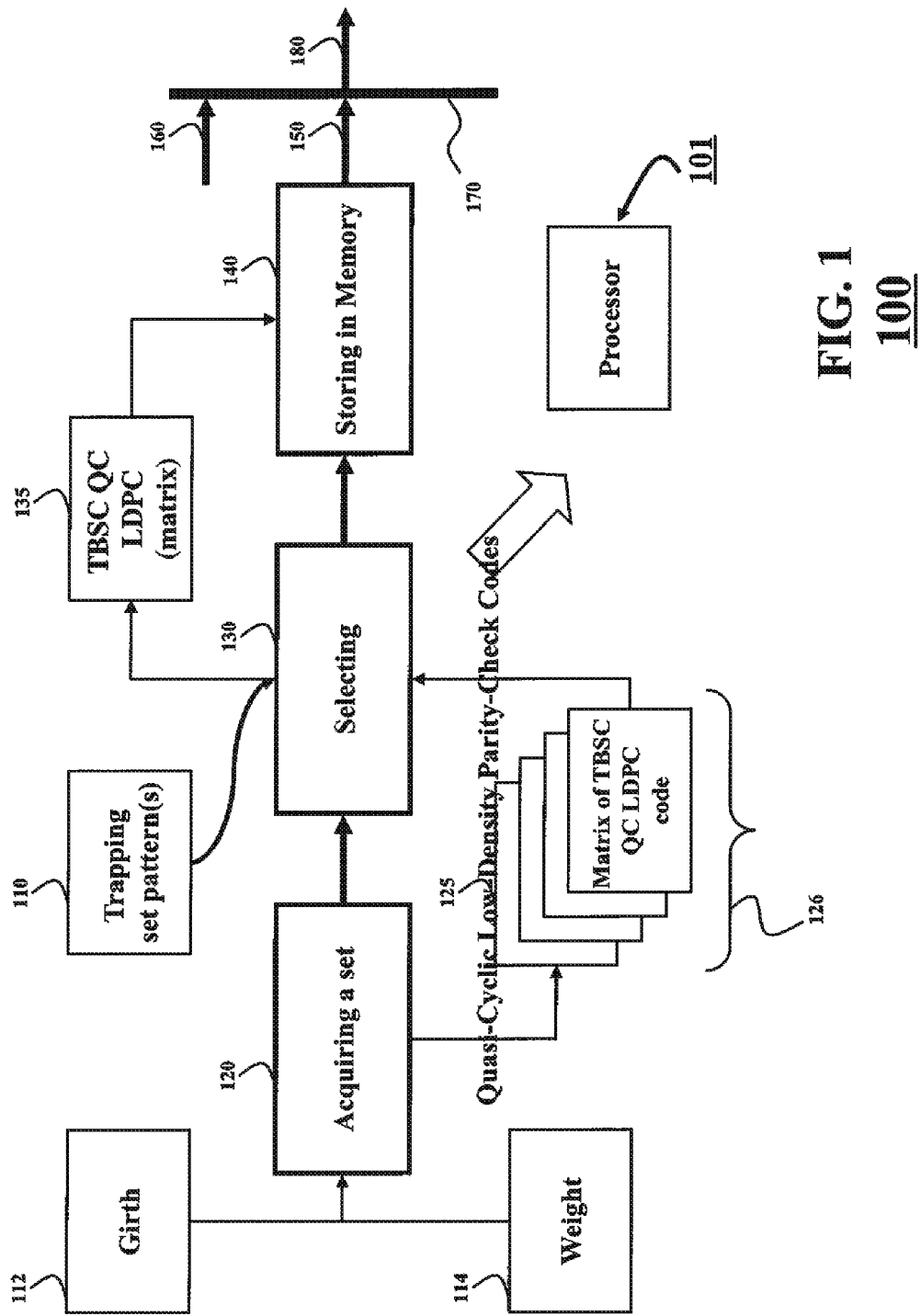
FIG. 1 is a block diagram of a method for determining a quasi-cyclic (QC) low-density parity-check (LDPC) code, such that the QC LDPC code has no trapping sets, according to some embodiments of the invention.

FIG. 1 shows a block diagram of a method 100 for determining a quasi-cyclic (QC) low-density parity-check (LDPC) code, such that the QC LDPC code has no trapping sets, according to some embodiments of the invention. The method can be performed by a processor 101, which can be operatively connected to a memory and input/output interfaces, as known in the art.

A set of matrices 126 representing a family of QC LDPC codes is acquired 120. Each QC LDPC code is a tail-biting spatially-coupled (TBSC) QC LDPC code of girth 112 having a value not less than eight, and each column of each matrix 125 in the set has a weight 114 having a value not less than four. The set of matrices can be determined, e.g., using a skeleton based matrix as described below, or received over a wired or wireless channel.

Next, the method selects 130, based on a trapping set pattern 110, a matrix 135 from the set of matrices, such that the matrix 135 represents the QC LDPC code without trapping sets. The matrix can be stored 140 in a memory 140. The matrix 135 can be submitted 150 to an encoder 170 for encoding data 160, and for transmitting 180 the encoded data. Similarly, the matrix 135 can be used for decoding the encoded data.

The trapping set pattern includes a pattern of six bits in the Tanner graph of the QC LDPC code, as shown in FIGS. 2A-D. The Tanner graph includes bits, e.g., bits 211-216, and parity checks, e.g., parity checks 219. Two bits can be connected to each other through parity check. The parity check can be a satisfied parity check or an unsatisfied parity check, based on the values of the bits. Bits can also be called variable nodes, or variables. The parity check can also be called a parity check node.

Figure 2B:
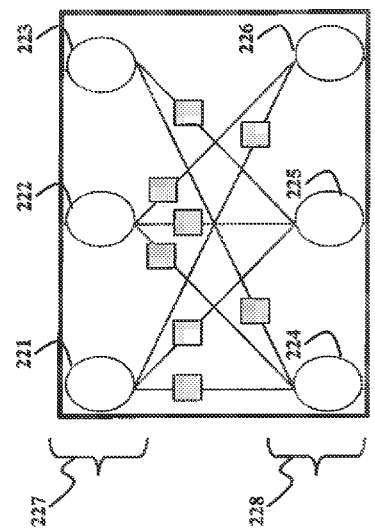
FIGS. 2A-D are examples of Tanner graph of the QC LDPC code that may include a trapping set pattern.
Figure 2D:
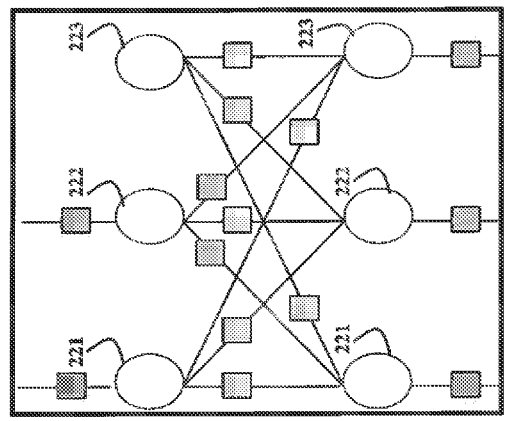
Figure 2A:
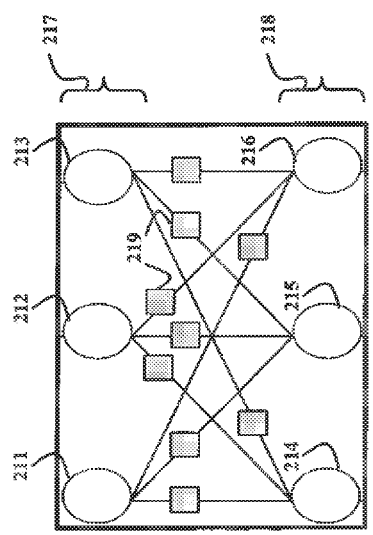

For example, FIG. 2A shows a trapping set pattern of fully connected six bits 211-216. Such trapping set pattern indeed includes a trapping set. As can be seen from FIG. 2A, the fully connected six bits form two groups of three bits, i.e., a first group 217 and a second group 218, wherein every bit in one group is connected to every bit in the other group.

FIG. 2B shows a candidate trapping set pattern of nearly fully connected six bits 221-226. This trapping set pattern may include a trapping set and is tested for the presence of the trapping set. The nearly fully connected six bits form two groups of three bits, including a first group 227 and a second group 228, wherein a first bit 221 and a second bit 222 of the first group is connected to every bit in the second group, and wherein a third bit 223 of the first group is connected to two bits in the second group.

Figure 2C:
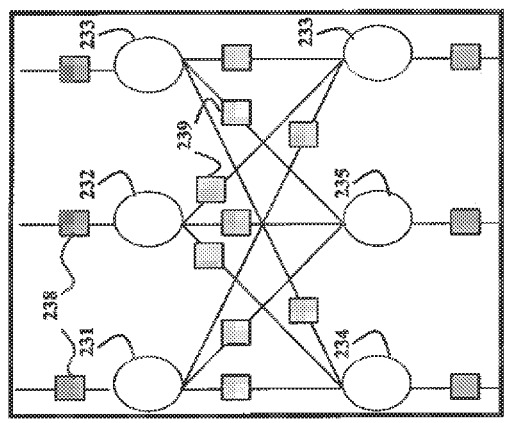

FIG. 2C shows the trapping set pattern that includes a pattern of six bits 231-236 in a Tanner graph of the matrix, wherein the six bits form two groups of three bits, wherein every bit in one group is connected to every bit in the other group through a "satisfied" parity check 239, and wherein each of the six bits is connected to one "unsatisfied" parity check 238.

When a trapping set is causing belief propagation (BP) decoder to fail, the bits in the trapping sets have incorrect beliefs, while the other bits in the code have correct beliefs. That is the reason for the names of the "satisfied" and "unsatisfied" parity checks. The satisfied parity checks are connected to two bits in the trapping set with incorrect beliefs, but because there are two of them, their parity is correct and they are satisfied. The unsatisfied parity checks are connected to a single bit in the trapping set with incorrect beliefs, and therefore have incorrect parity.

FIG. 2D shows the trapping set pattern that includes a pattern of six bits 241-246, wherein one unsatisfied parity check is removed. If only unsatisfied parity checks are removed from the trapping set pattern, the trapping set pattern remains a trapping set, because the unsatisfied parity checks bring in correct information in a BP decoder. Thus, both patterns of FIGS. 2C and 2D are considered trapping set patterns of fully connected six bits.

QC LDPC Codes

Various embodiments of the invention determine quasi-cyclic (QC) LDPC codes, which are structured codes whose decoders are easier to be constructed in hardware. The QC LDPC codes have therefore been used in many standards.

Let $I_{i,p}$ denote the circulant permutation matrix, or "cyclic shift matrix," obtained by cyclically right-shifting a p×p identity matrix by i positions, where $0 \le i \le -1$. Thus, $I_{0,p}$ is the p×p identity matrix. In this disclosure, we often suppress the dependence on p by writing $I_i$ instead of $I_{i,p}$. As an example, if p=4, then the circulant permutation matrix shifted by one position is $$I_1 = \begin{bmatrix} 0 & 1 & 0 & 0 \\ 0 & 0 & 1 & 0 \\ 0 & 0 & 0 & 1 \\ 1 & 0 & 0 & 0 \end{bmatrix}.$$

Let $0_p$ denote the p×p all-zeroes matrix. A QC LDPC code has a parity check matrix that is composed entirely from p×p sub-matrices that are either p×p circulant permutation matrices, or p×p all-zeroes matrices. For example, the following would be the parity check matrix for a QC LDPC code, where p=3:

$$H = \begin{bmatrix} 0 & 1 & 0 & 0 & 0 & 0 & 1 & 0 & 0 \\ 0 & 0 & 1 & 0 & 0 & 0 & 0 & 1 & 0 \\ 1 & 0 & 0 & 0 & 0 & 0 & 0 & 0 & 1 \\ 0 & 0 & 1 & 1 & 0 & 0 & 1 & 0 & 0 \\ 1 & 0 & 0 & 0 & 1 & 0 & 0 & 1 & 0 \\ 0 & 1 & 0 & 0 & 0 & 1 & 0 & 0 & 1 \end{bmatrix}.$$

In this example, the parity-check matrix is constructed from 3×3 sub-matrices as:

$$H = \begin{bmatrix} I_1 & 0 & I_0 \\ I_2 & I_0 & I_0 \end{bmatrix}.$$

The QC LDPC code can equivalently be described in terms of its "base matrix," which lists the circulant shifts and uses "-1" to denote an all zeroes matrix. Thus, the base matrix equivalent to the parity check matrix in our example is $$B = \begin{bmatrix} 1 & -1 & 0 \\ 2 & 0 & 0 \end{bmatrix}.$$

Tail-Biting Spatially-Coupled QC LDPC Codes

A tail-biting spatially-coupled QC LDPC code is a QC LDPC code whose base matrix has a particular structure. There are a few parameters describing a TBSC QC LDPC code, i.e., p (the size of the p×p sub-matrices), J (the number of rows in the base-matrix), L (the number of columns in the base-matrix, S (the number of non-negative entries in each row of the base-matrix), and W (the number of non-negative entries in each column of the base matrix.

The last row of the base matrix of a regular TBSC QC LDPC code in conventional form begins with L−S "−1" entries (representing all-zero matrices), followed by S entries that are non-negative integers ranging from 0 to p−1. The next to last row above that is also has S non-negative entries and L−S entries that are equal to −1, but the positions of the non-negative entries is shifted to the left by G=L/J. In each row above, the positions of the non-negative entries are further shifted to the left by the same value. In the top rows, the positions of the non-negative entries wrap around to the right-hand side of the matrix. For example, the following is an example base matrix for a standard form regular TBSC QC LDPC code with parameter values p=3, J=5, L=10, S=6, W=3, G=2:

$$B = \begin{bmatrix} 0 & 2 & -1 & -1 & -1 & -1 & 1 & 0 & 1 & 2 \\ 1 & 0 & 2 & 1 & -1 & -1 & -1 & -1 & 0 & 1 \\ 2 & 1 & 1 & 0 & 2 & 1 & - & -1 & -1 & -1 \\ -1 & -1 & 1 & 2 & 0 & 2 & 1 & 2 & -1 & -1 \\ -1 & -1 & -1 & -1 & 1 & 0 & 2 & 2 & 1 & 1 \end{bmatrix}.$$

Cycles in the Tanner Graph of QC LDPC Codes

The LDPC code can described using the "Tanner graph," which is a bi-partite graph including "variable" nodes representing the codeword bits, and "check" nodes representing the parity checks, where a variable node is connected to a check node by an edge if and only if the corresponding entry in the parity check matrix for the code is nonzero.

Cycles in the Tanner graph of QC LDPC codes can be identified using their parity check matrices. Each check node in the Tanner graph of a code corresponds to a row in its parity check matrix, and each variable node corresponds to a column. A cycle is a path through nodes in the Tanner graph, alternating between check and variable nodes, which begins and ends at the same node. In terms of the parity check matrix of the code, a cycle can be visualized as a sequence of alternating vertical and horizontal moves through the matrix starting and ending on the same row of the matrix. A vertical move (along a column) corresponds to selecting a second edge connected to the same variable node that forms the next step in the cycle. A horizontal move (along a row) corresponds to selecting two edges connected to the same check node that form part of the path.

For QC LDPC codes, cycles in the Tanner graph can be identified based on conditions on the base matrix, i.e., values of the elements/parameters of the base matrix. Thus, adjusting the non-negative parameters of the base matrix can be used to eliminate short cycles. The "girth" of the Tanner graph of an LDPC code is the length of its shortest cycle.

Exemplar Embodiments

Figure 3:
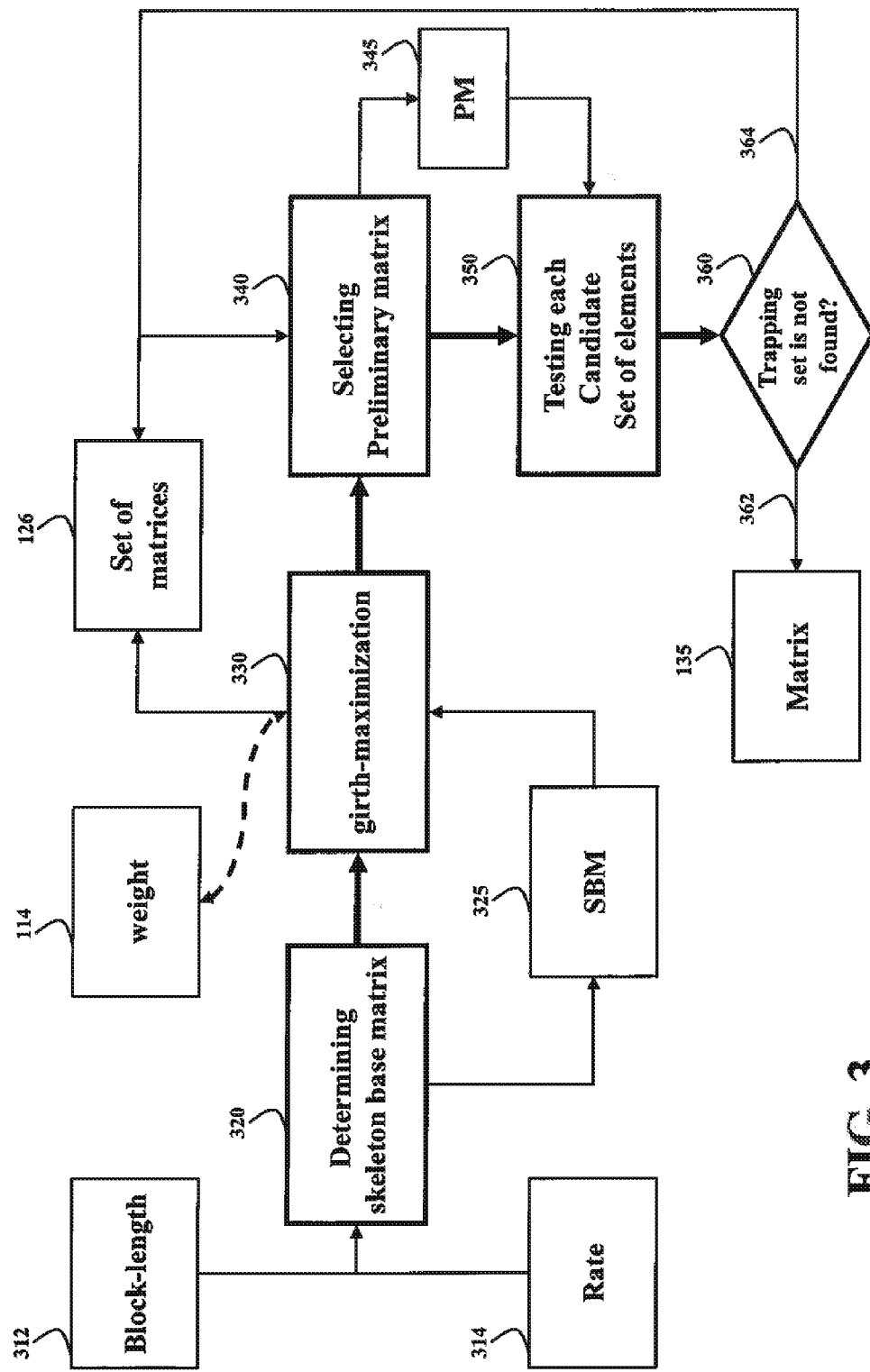
FIG. 3 is a block diagram of another embodiment of the invention.
Figure 4:
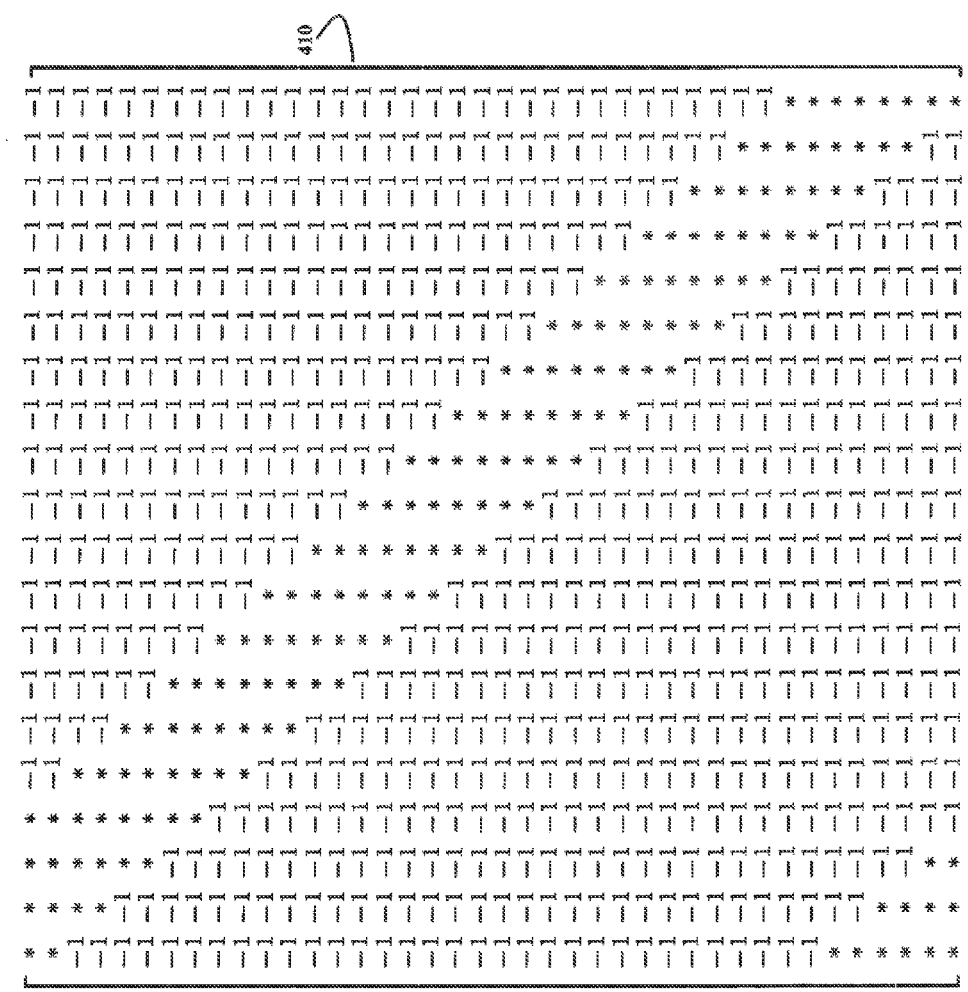

FIG. 3 shows a non-limited example of one embodiment of the invention. In this embodiment, a skeleton base matrix (SBM) 325 of a tail-biting spatially-coupled code is determined 320 such that the weight of each column is four. The skeleton base matrix represents a farriily of codes that have a block-length 312 and a rate 314, and is used to determine the set of matrices 126. The block-length and the rate can be predetermined or determined in real time, e.g., randomly. An example 410 of a transpose of the skeleton base matrix 325 is shown in FIG. 4, as described in more details below.

Next, a girth-maximization method 330 is applied to the skeleton base matrix to produce the set of matrices 126. Various girth-maximization methods can be used by the embodiment. In one variation of this embodiment, a specific girth-maximization procedure is selected such that the column weights of each matrix 125 in the set 126 are preserved.

In some embodiments, the selection 130 includes selecting 340, from the set of matrices, a preliminary matrix 345 having no pattern of fully connected six bits in a corresponding Tanner graph. This is because the matrix in the corresponding Tanner graph has a pattern of fully connected six bits includes a trapping set, and should not be selected as the matrix 135.

If the preliminary matrix 340 does not have a pattern of fully connected six bits and nearly-fully connected six bits in the corresponding Tanner graph, the matrix represents the QC LDPC codes with no trapping sets and is selected as the matrix 135. However, if the preliminary matrix includes one or more sets of elements forming a pattern of nearly fully connected six bits in the corresponding Tanner graph, such matrix may or may not include the trapping set.

Accordingly, in one embodiment of the invention, the selecting 130 includes testing 350, for each candidate set of elements in the preliminary matrix forming a pattern of nearly-fully connected six bits in the corresponding Tanner graph, whether the candidate set of elements is a trapping set. If no trapping sets are found 360, then the preliminary matrix is selected 362 as the matrix 135. Otherwise, the above steps are repeated 364 for the next preliminary matrix selected from the set 126.

Skeleton Base Matrix

The skeleton base matrix is determined for standard form regular TBSC QC LDPC code with column degree W=4 that matches the desired block-length N and rate R. Different choices of parameter values are possible, but there are certain constraints. In particular, N, p, and L are related by the equation N=pL, and R, J, and L is related by the equation R=1−J/L. The skeleton base matrix has undetermined any of the non-negative entry values. The non-negative entries of the skeleton base matrix are denoted with a symbol * below.

For example, suppose that we desired a code of length N=9600, with rate R=½. We could choose the parameter values p=800, J=6, L=12, S=8, W=4, G=2, and a skeleton base matrix B can be $$B = \begin{bmatrix} * & * & -1 & -1 & -1 & -1 & * & * & * & * & * & * \\ * & * & * & * & -1 & -1 & -1 & -1 & * & * & * & * \\ * & * & * & * & * & * & -1 & -1 & -1 & -1 & * & * \\ * & * & * & * & * & * & * & * & -1 & -1 & -1 & -1 \\ -1 & -1 & * & * & * & * & * & * & * & * & -1 & -1 \\ -1 & -1 & -1 & -1 & * & * & * & * & * & * & * & * \end{bmatrix}. \quad (1)$$

In this example, the columns of the skeleton base matrix are organized into pairs that are identical. More generally, the columns of this skeleton base matrix can be organized into groups of size G.

For certain values of the block-length N and rate R, some embodiments use an irregular structure, where certain groups of columns have a different size than other groups of columns. For example, the following skeleton base matrix can be used for a code with rate R=7/13:

$$B = \begin{bmatrix} * & * & -1 & -1 & -1 & -1 & * & * & * & * & * & * & * \\ * & * & * & * & -1 & -1 & -1 & -1 & * & * & * & * & * \\ * & * & * & * & * & * & -1 & -1 & -1 & -1 & * & * & * \\ * & * & * & * & * & * & * & * & -1 & -1 & -1 & -1 & -1 \\ -1 & -1 & * & * & * & * & * & * & * & * & -1 & -1 & -1 \\ -1 & -1 & -1 & -1 & * & * & * & * & * & * & * & * & * \end{bmatrix}. \quad (2)$$

This base matrix is similar to that in Equation (1). The only difference is that the last group of two identical columns has been replaced with a group of three identical columns.

Some embodiments use larger values of J and L, and correspondingly reduce the size of p. For larger values of J and L, it is easier to make irregular versions of the base matrix that improve the waterfall performance, as described below. However, the resulting base matrices become very large, and it is easier to show the matrices by using the transposed base matrix B'. As a specific example, FIG. 4 shows a skeleton transposed base matrix 410 determined for parameter values N=9600, R=½, p=240, J=20, L=40, S=8, W=4, G=2.

Girth Maximization

Various girth-maximization methods can be used by the embodiments of the invention. In some embodiments, a specific girth-maximization method is selected such that the weights of each matrix 125 in the set 126 are preserved.

Figure 7:
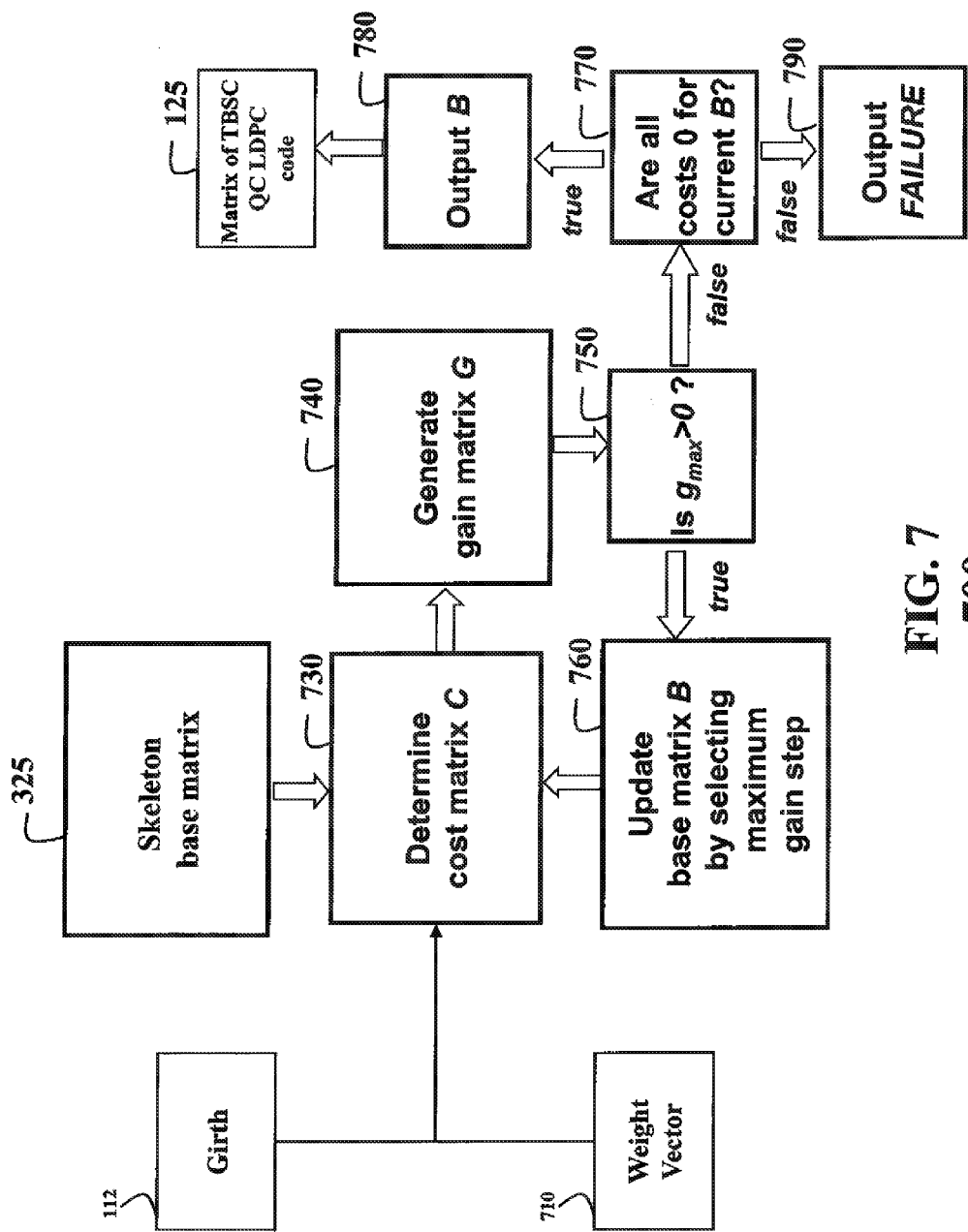
FIG. 7 is a block diagram of a girth-maximization method.

FIG. 7 shows an example of a girth-maximization method 700, which optimizes the girth of the QC LDPC code such that the weights of each matrix 125 in the set 126 are preserved. One input to the girth maximization procedure is a skeleton base matrix 325 that specifies a family of TBSC QC LDPC codes. Another input is a desired girth 112; e.g., eight. The desired output is a matrix 125 for a TBSC QC LDPC code of the desired girth that has the form specified by the skeleton base matrix, but where the unknown parameters in the skeleton base matrix are definite values. We initialize the method 700 with a code selected, e.g., randomly, from the ensemble of codes that have the desired skeleton base matrix structure. In other words, we initially select all the non-negative parameters in the base matrix at random from all the possible values of 0 to p−1.

Another input to the method is a "cost function" associated with each type of cycle. The cost function used depends on the number of cycles in the current code that have length less than the desired girth. A weight vector 710 is used, such that shorter cycles are weighted to be more costly than longer cycles. For example, if girth 8 is desired, then we could assign a cost of 10 for each four-cycle, and a cost of 1 for each six-cycle. Because the procedure tries to minimize cost, the procedure first removes four-cycles, and then six-cycles.

The girth maximization iteratively updates the current non-negative parameters in the base matrix. During each iteration, the single non-negative parameter is changed to the value that effects the greatest reduction in the cost function. In detail, a "cost matrix" is determined 730, which, for each non-negative parameter value, gives the cost of changing that parameter value to every other possible value from 0 to p−1. From the cost matrix, a "gain matrix" can be generated 740, which gives the improvement in cost for changing each possible non-negative parameter value from its current value to each possible other value.

At each iteration, the method checks 750 whether there is a positive gain that improves the cost. If the gain is positive, then the single non-negative parameter value change that most improves the cost is selected and is used to update the base matrix 760 appropriately. Then, we re-determine the cost matrix 730 and iterate.

The method 700 terminates when we can no longer change any single parameter value to a value that further reduces the cost (and thus the number of undesired cycles). Formally, this means that the maximum gain in the gain matrix is no longer positive 750. At that point, we check 770 whether the costs are zero in the current base matrix. If they are, then we have found a base matrix that does not have any short cycles; e.g., if girth eight is the goal, a cost of zero indicates that there are no 4-cycles or 6-cycles. Therefore, in that case we output the base matrix 780 representing the TBSC LDPC code of the desired girth 125.

If we cannot any longer improve the cost, but the current cost function is positive, then the procedure has failed 790. For certain values of p and the desired girth g, the procedure cannot succeed; in particular if p is too small and g is too large. However for girth eight and large enough values of p, the procedure normally succeed, and can be used multiple times to generate a set of matrices 126 that conform to the structure specified by the skeleton base matrix and that has the desired girth.

Figure 5:
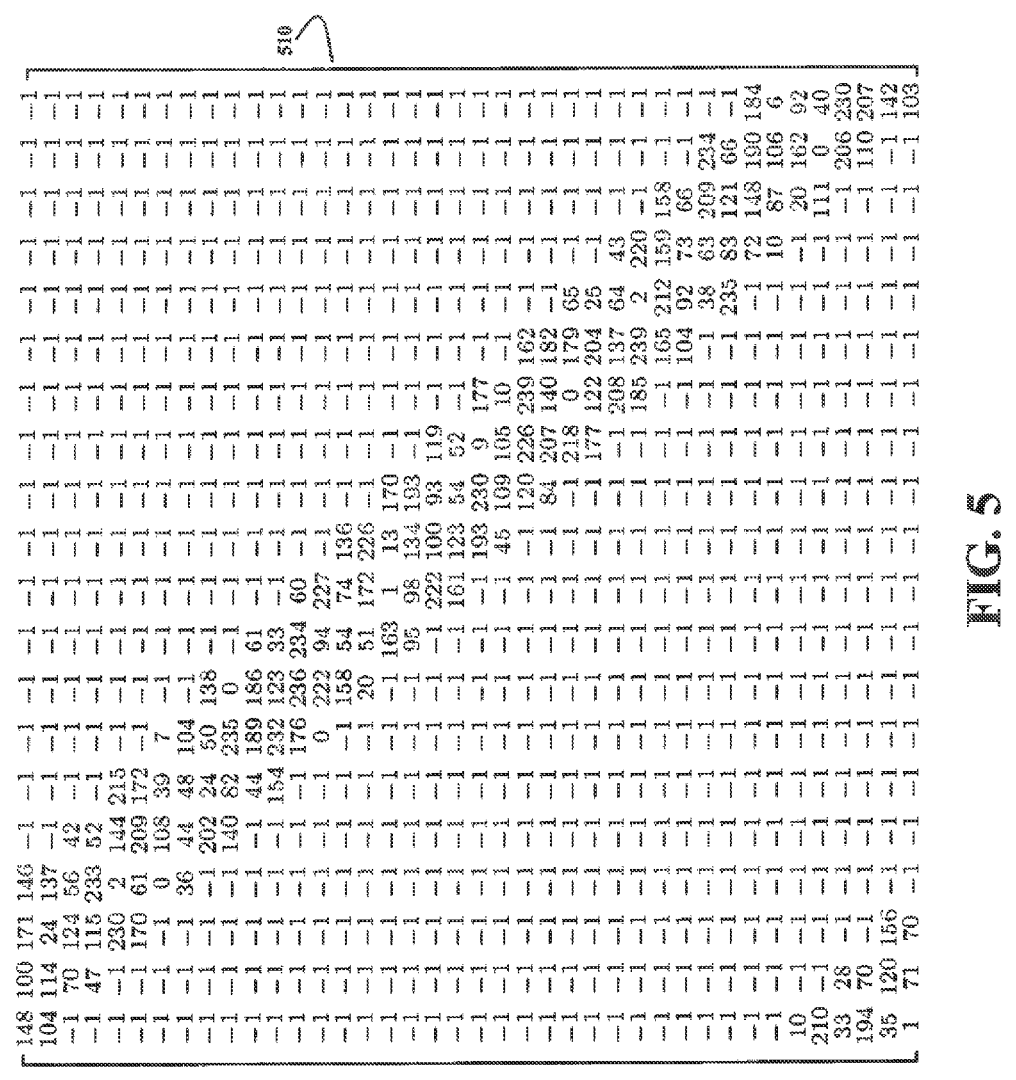

FIG. 5 shows the transposed base matrix 510 obtained using the girth maximization procedure with the girth of eight and corresponding to the skeleton base matrix 410, with a parameter value of p=240. The procedure successfully found codes with the desired girth and structure.

Testing Set of Candidate Elements

A set of candidate elements of the matrix representing a TBSC QC LDPC code forms a trapping set candidate in the corresponding Tanner graph, i.e., the pattern of nearly-fully connected six bits. The set of candidate elements may form a trapping set, or not, i.e., may in fact not form a trapping set. Accordingly, various embodiments of the invention search for the set of candidate elements, and test each set to determine whether the set is a trapping set. In one embodiment, the testing process uses belief propagation (BP) decoder assuming a binary symmetric channel, where each bit in the trapping set candidate is initialized to the incorrect value, and all other bits in the graph are initialized to the correct value. If the BP decoder fails to decode successfully, then the trapping set candidate is a true trapping set, and the code is unacceptable.

Figure 8:
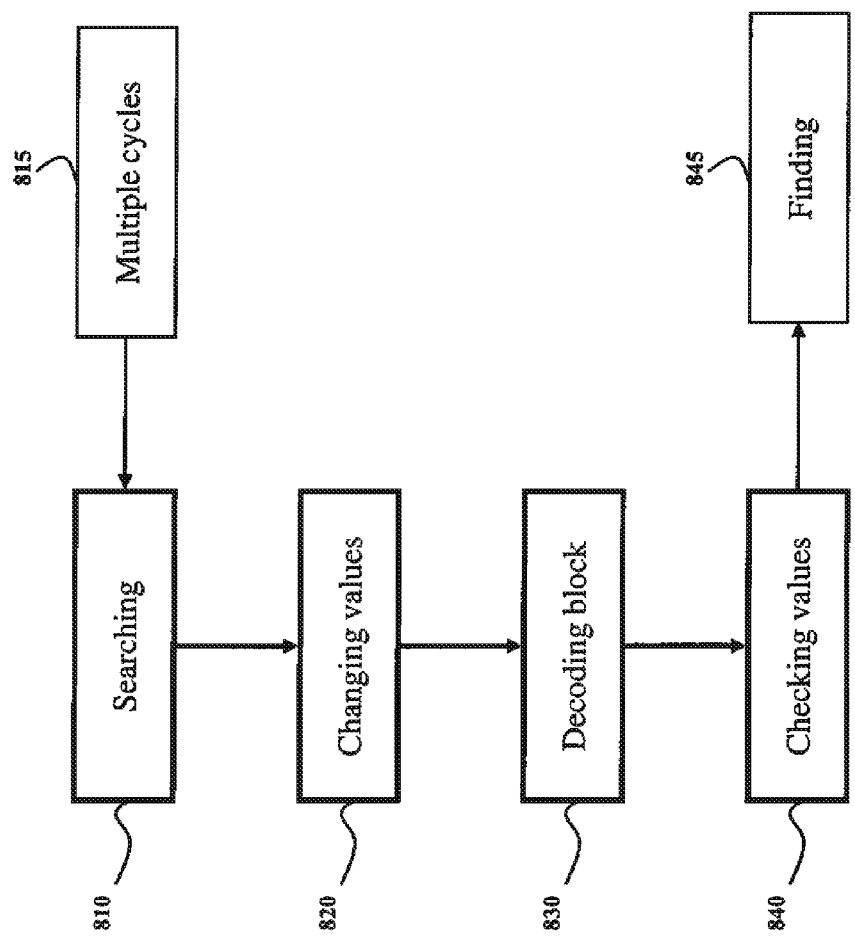
FIG. 8 is a block diagram of a method for searching and testing each set of candidate elements according to some embodiments of the invention.

FIG. 8 shows a block diagram of a method for searching and testing each set of candidate elements. The method searches 810 for the pattern of fully connected six bits and/or for the pattern of nearly fully connected six bits in each matrix in the set of matrices. For example, one embodiment determines candidate six bits forming multiple cycles 815 of length eight in a corresponding Tanner graph, and determines whether the candidate six bits form the pattern of fully connected six bits and/or the pattern of nearly fully connected six bits.

For each set of candidate elements, a block is constructed wherein the correct values of the candidate bits in the Tanner graph of the code are changed 820 to be incorrect, while preserving correct values of all other bits in the code. The block is then decoded 830 using the BP decoder, and the result of decoding is checked 840 for correctness. If the decoder failed to decode the block, then the method finds 845 that the set of candidate elements forms a trapping set. Otherwise, the method finds 845 that the set of candidate elements does not form a trapping set.

Modifying the TBSC QC LDPC Code

Codes with fully regular weights of the columns, e.g., weight equals four, may not optimize the waterfall performance. Usually, the waterfall performance is improved when some columns are changed to higher degrees. Accordingly, some embodiments of the invention increase a weight of at least one column of the matrix. The new increased value of the weight can be any value greater than four, and less than or equal to the maximum column weight. The increasing step can be applied during any stage of the method. For example, the increasing can be applied to the matrix 125 or to the matrix 135.

The choice of which columns to change to higher degrees can be made using, e.g., a density evolution method. In one embodiment the code is tested on the binary erasure channel (BEC), and a threshold of the code for the BEC is optimized using density evolution. The "threshold" for the BEC would be the maximum erasure probability such that the code will continue to decode successfully, within the density evolution approximation.

The weight of the higher weight columns can be determined in a variety of ways. Selecting full column weight (every element in the column of the base matrix is non-negative) may give the best threshold performance under density evolution, but it may be inconvenient for the practical construction of a decoder in hardware. Alternatively, one embodiment selects the largest weight compatible with hardware implementation.

Bits corresponding to higher weight columns have many inputs from unsatisfied parity checks, and therefore do not participate in any trapping sets. Therefore, these bits are ignored when searching for trapping sets.

Figure 6:
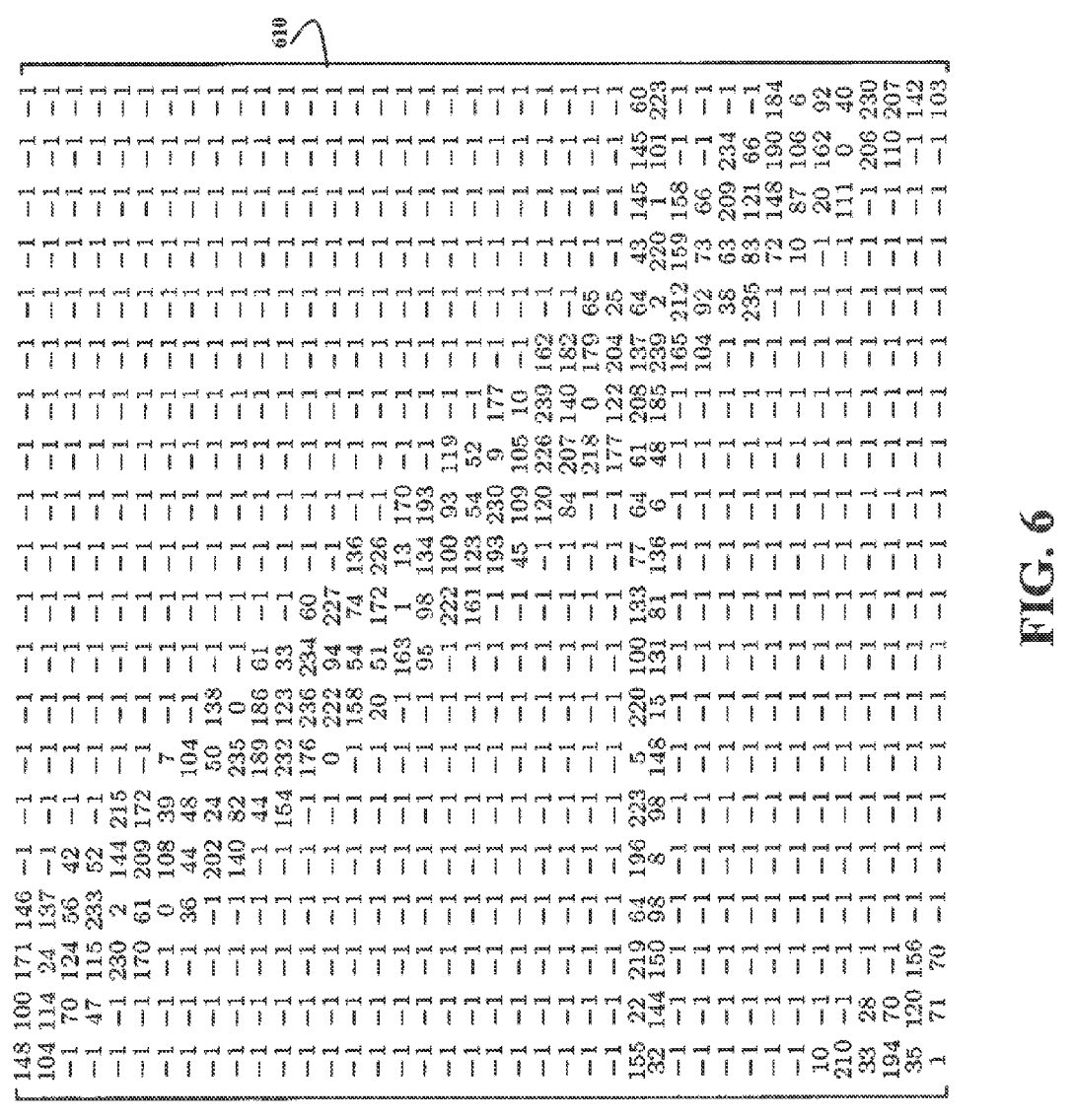

FIG. 6 shows an example of the transposed base matrix 610 of such code. In this example, the density evolution threshold of the code with transposed base matrix 510 on the BEC is improved by converting two columns of the matrix from weight four to weight twenty. The exact values of the base matrix entries in the higher weight columns that are changed from −1 to a non-negative value are not always important. For example, the values can be random, or determined by a girth-maximization method.

Optionally Delete Entries from the Base Matrix

Some embodiments improve the waterfall performance of the code by removing elements from the base matrix 135 by transforming some weight four columns into weight three columns. In some embodiments, the elements are removed from the base matrix to reduce the weight of at least one column to weight three. The removed elements can be selected using a density evolution method. Additionally or alternatively, the removed elements can be selected based on corresponding positions of the elements in trapping set patterns or candidate trapping set patterns.

Typically, the conversion of the columns into weight three columns makes trapping sets more likely to occur. Therefore, embodiments normally limit the number of converted columns. Furthermore, elements of the base matrix are removed based on the likelihood that the removal can cause a true trapping set. This is possible because each base matrix entry corresponds to an edge between a check node and a bit node in the Tanner graph. One embodiment removes, if possible, base matrix entries that correspond to "internal edges" in trapping set candidates, rather than external edges.

Figure 9:
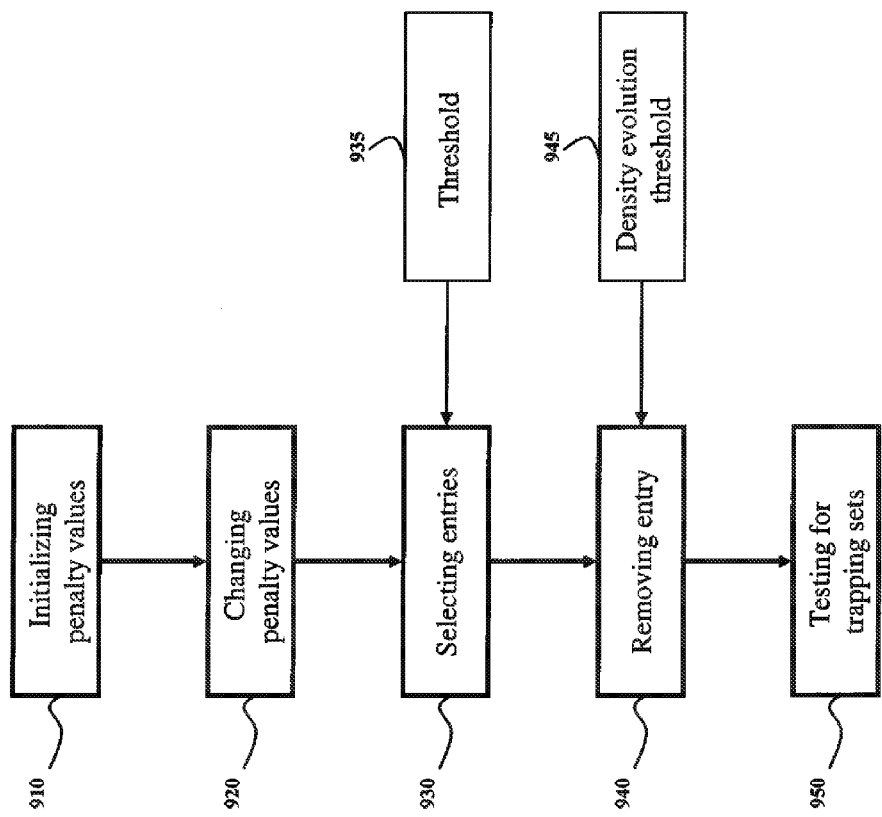
FIG. 9 is a block diagram of a method for selecting entries of a matrix to be removed.

FIG. 9 shows an example of a method to select the entries to be removed. At step 910 the method sets the number of entries to remove. A penalty value is assigned to each entry (i.e., each edge) in the base matrix with the initial values equal to, e.g., zero.

During step 920, the penalty values are modified based on corresponding positions in of the elements in the trapping set pattern. If the entry is an internal edge for a trapping set candidate, its penalty value is decreased by one. If it is an external edge for a trapping set candidate, then the penalty value is increased by'one. If the entry belongs to a trapping set that already has one external check removed, then set the penalty value of this entry to infinity.

During step 930, a set of entries with penalty values below a threshold 935 is selected. During step 940, the entry in the set that maximizes a density evolution threshold 945 is removed. For example, the method selects a number of entries with the smallest penalty values and select the one that improves the density evolution threshold the most to remove. The abovementioned steps can be repeated to remove multiple entries. After the entries to remove are selected, one embodiment tests 950 whether any true trapping sets are introduced by removing the entries.

Figure 10:
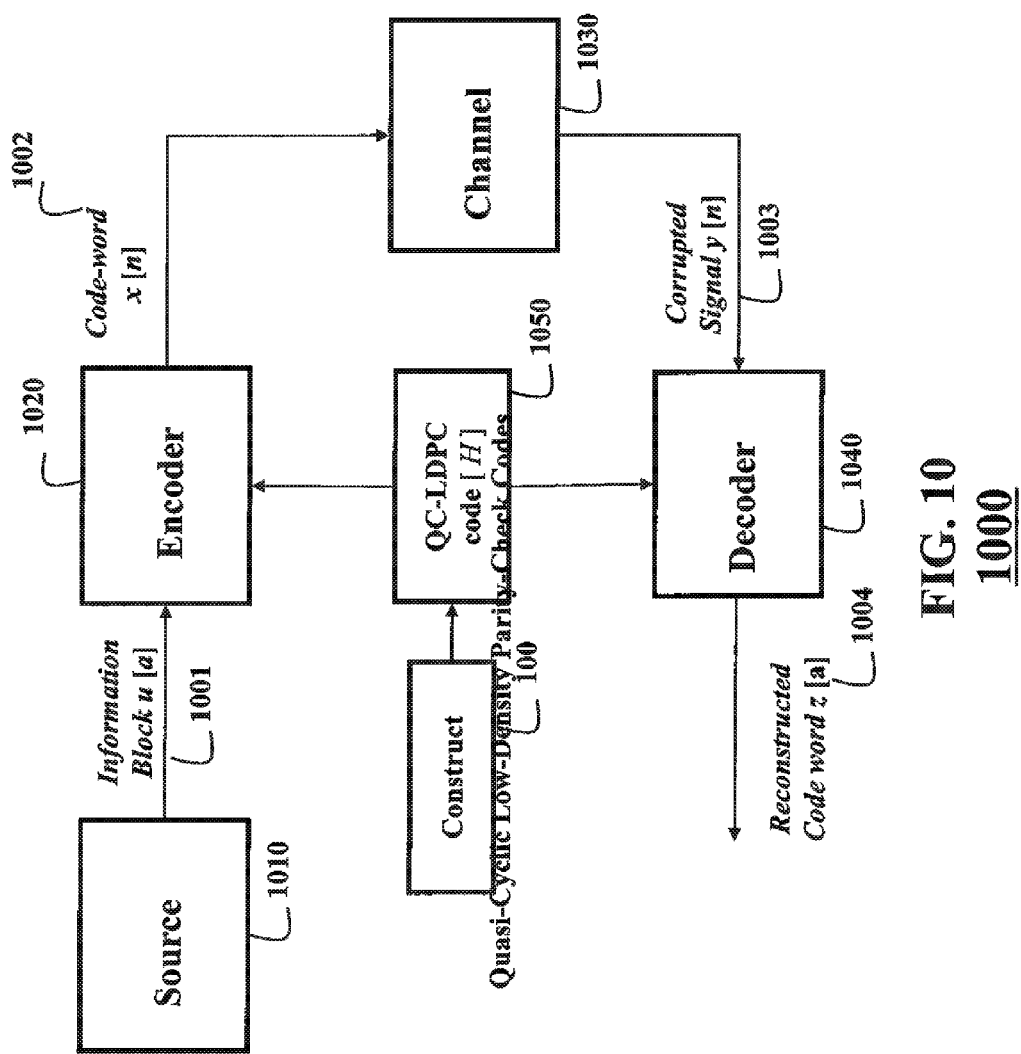
FIG. 10 is a schematic of various systems employing some embodiments of the invention.

The QC LDPC code determined by embodiments of the invention can be used in both decoding and encoding procedure, such as by a system 1000 shown in FIG. 10. The embodiments of the invention provide the method 100 for constructing a quasi-cyclic low-density parity-check (QC-LDPC) code with a high girth, which can be stored in a memory 1050. Such a code can then be used by an encoder 1020 to encode data, e.g., an information block 1001 of k symbols u[a] generated by a source 1010. The encoded data can be transmitted through a noisy channel 1030 as a code-word x[n] 1002 including N symbols. The channel can be a communications channel. The "channel" can also be storage media. In this case, the code-word is written to the media for later retrieval.

It is possible for the channel to corrupt the code-word to a signal y[n] 1003. The signal is then passed to a decoder 1040, which attempts to output a reconstruction z[a] 1004 of the information block u[a] 1002 using the QC-LDPC code 1050.

The above-described embodiments of the present invention can be implemented in any of numerous ways. For example, the embodiments may be implemented using hardware, software or a combination thereof. When implemented in software, the software code can be executed on any suitable processor or collection of processors, whether provided in a single computer or distributed among multiple computers. Such processors may be implemented as integrated circuits, with one or more processors in an integrated circuit component. Though, a processor may be implemented using circuitry in any suitable format.

Further, a computer can be embodied in any of a number of forms, such as a rack-mounted computer, a desktop computer, a laptop computer, minicomputer, or a tablet computer. Such computers may be interconnected by one or more networks in any suitable form, including as a local area network or a wide area network, such as an enterprise network or the Internet. Such networks may be based on any suitable technology and may operate according to any suitable protocol and may include wireless networks, wired networks or fiber optic networks.

Also, the embodiments of the invention may be embodied as a method, of which an example has been provided. The steps performed as part of the method may be ordered in any suitable way. Accordingly, embodiments may be constructed in which steps are performed in an order different than illustrated, which may include performing some acts simultaneously, even though shown as sequential acts in illustrative embodiments.

Use of ordinal terms such as "first," "second," in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

The invention has been described by way of examples of preferred embodiments. It is to be understood that various other adaptations and modifications may be made within the spirit and scope of the invention. Therefore, it is the object of the appended claims to cover all such variations and modifications as come within the true spirit and scope of the invention.

We claim:

1. A method for determining a quasi-cyclic (QC) low-density parity-check (LDPC) code, such that the QC LDPC code has no trapping sets, comprising the steps of:

acquiring a set of matrices representing a family of QC LDPC codes, wherein each QC LDPC code is a tail-biting spatially-coupled code of girth not less than eight, and wherein each column of each matrix in the set has a weight not less than four;

selecting, based on a trapping set pattern, a matrix from the set of matrices, such that the matrix represents the QC LDPC code with no trapping sets, wherein the trapping set pattern is a pattern of six bits in a corresponding Tanner graph; and storing the matrix into a memory, wherein the steps of the method are performed by a processor.

2. The method of claim 1, wherein the acquiring further comprises:

determining a skeleton base matrix of a tail-biting, spatially-coupled code such that the weight of each column is four, and such that the skeleton base matrix represents a family of codes that have a predetermined block-length and a predetermined rate; and applying to the skeleton base matrix a girth-maximization procedure to produce the set of matrices, wherein the girth-maximization procedure preserves the weights.

3. The method of claim 1, wherein the trapping set pattern includes a pattern of six bits in a corresponding Tanner graph, wherein the six bits form first and second groups of three bits, and wherein every bit in the first group is connected to every bit in the second group by a parity check.

4. The method of claim 1, wherein the trapping set pattern includes a pattern of six bits in a Tanner graph of the matrix, wherein the six bits form two groups of three bits, wherein every bit in one group is connected to every bit in the other group through a satisfied parity check, and wherein each of the six bits is connected to one unsatisfied parity check.

5. The method of claim 1, wherein the trapping set pattern includes a pattern of six hits in a Tanner graph of the matrix, wherein each of the six bits is connected to three or four bits through parity checks, wherein the six bits form two groups of three bits, including a first group and a second group, wherein a first bit and a second hit of the first group are connected to every bit in the second group, and wherein a third bit of the first group is connected to two bits in the second group.

6. The method of claim 1, wherein the selecting further comprises:
selecting, from the set of matrices, a preliminary matrix having in a corresponding Tanner graph no pattern of fully connected six bits, wherein the fully connected six bits form two groups of three bits, wherein every bit in one group is connected to every bit in the other group;
testing, for each set of candidate elements in the preliminary matrix forming a pattern of nearly-fully connected six bits in the corresponding Tanner graph, whether the set of candidate elements includes a trapping set, wherein the nearly-fully connected six bits form two groups of three bits, including a first group and a second group, wherein a first bit and a second hit of the first group are connected to every bit in the second group, and wherein a third it of the first group is connected to two bits in the second group; and
selecting the preliminary matrix as the matrix if the trapping set is not found.

7. The method of claim 6, wherein the testing comprises:
changing correct values of the candidate elements to be incorrect, while preserving correct values of other elements in the preliminary matrix;
decoding values of elements of the preliminary matrix using a belief propagation decoder; and
finding, that the candidate elements include the trapping set if the decoder failed to decode the correct values of the candidate elements.

8. The method of claim 6, further comprising:
searching for the pattern of fully connected six bits and for the pattern of nearly-fully connected six hits in each matrix in the set of matrices.

9. The method of claim 8, wherein for each matrix the searching comprises:
determining candidate six bits forming multiple cycles of length eight in a corresponding Tanner graph; and
determining whether the candidate six bits form the pattern of fully connected six bits or the pattern of nearly-fully connected six bits.

10. The method of claim 1, farther comprising:
increasing a weight of at least one column of the matrix.

11. The method of claim 10, wherein the increasing comprising:
maximizing the weight of the at least one column.

12. The method of claim 10, wherein the columns whose weights are increased are selected using a density evolution method.

13. The method of claim 1, further comprising:
removing elements from the base matrix so as to reduce the weight of at least one column to weight three.

14. The method of claim 13, wherein the removed elements are selected using a density evolution method.

15. The method of claim 13, wherein the removed elements are selected based on corresponding positions in of the elements in the trapping set pattern.

16. The method of claim 13, further comprising:
initializing penalty values for at least some entries of the matrix;
modifying the penalty values based on corresponding, positions in of the elements in the trapping set pattern, wherein a penalty value of an entry is increased if the entry corresponds to an external edge in the trapping set pattern, wherein the penalty value of the entry is decreased if the entry corresponds to an internal edge in the trapping set pattern, and wherein the penalty value of the entry is set to infinity if the entry corresponds to the trapping set pattern having one external check removed;
selecting a set of entries with penalty values below a threshold;
removing the entry in the set that maximizes a density evolution threshold; and
testing for a presence of the trapping set in the matrix.

17. A system for encoding data based on a quasi-cyclic (QC) low-density parity-check (LDPC) code, comprising:
a source for providing the data;
a memory for storing a QC LDPC code represented by a parity check matrix, wherein the parity check matrix represents a tail-biting spatially-coupled (TBSC) QC LDPC code with no trapping sets, wherein a trapping set is a pattern of six hits in a corresponding Tanner graph; and
an encoder for encoding the data using the TBSC QC LDPC code to produce an encoded data, and for transmitting the encoded data over a channel.

18. The system of claim 17, wherein the TBSC QC LDPC code has a girth at least equal to eight, and a weight of a majority of columns in the matrix equal to four.

19. A method for determining a quasi-cyclic (QC) low-density parity-check (LDPC) code, comprising the steps of:
determining a skeleton base matrix of a tail-biting spatially-coupled code such that a weight of each column equals four;
applying to the skeleton base matrix a girth-maximization procedure to produce the set of matrices representing a family of QC LDPC codes, wherein each QC LDPC code is a tail-biting spatially-coupled code of girth not less than eight, and wherein each column of each matrix in the set has a weight not less than four;
selecting, from the set of matrices, a preliminary matrix having in a corresponding Tanner graph no pattern of fully connected six bits, wherein the fully connected six bits form two groups of three bits, wherein every bit in one group is connected to every bit in the other group;
testing, for each set of candidate elements in the preliminary matrix forming a pattern of nearly-fully connected six bits in the corresponding Tanner graph, whether the set of candidate elements includes a trapping set, wherein the nearly-fully connected six bits form two groups of three bits, including a first group and a second group, wherein a first bit and a second bit of the first group is connected to every bit in the second group, and wherein a third bit of the first group is connected to two bits in the second group; and
finding the preliminary matrix as a matrix representing the QC LDPC code with no trapping sets, if the trapping set is not found; and otherwise
repeating the selecting, the testing, and the finding, wherein the steps of the method are performed by a processor.

* * * * *